(12) United States Patent
Kuribayashi et al.

(10) Patent No.: US 12,148,621 B2
(45) Date of Patent: Nov. 19, 2024

(54) METHOD OF PROCESSING SUBSTRATE, METHOD OF MANUFACTURING SEMICONDUCTOR DEVICE, RECORDING MEDIUM, AND SUBSTRATE PROCESSING APPARATUS

(71) Applicant: Kokusai Electric Corporation, Tokyo (JP)

(72) Inventors: Koei Kuribayashi, Toyama (JP); Arito Ogawa, Toyama (JP); Atsuro Seino, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 18/194,026

(22) Filed: Mar. 31, 2023

(65) Prior Publication Data

US 2023/0238244 A1 Jul. 27, 2023

Related U.S. Application Data

(63) Continuation of application No. 17/159,252, filed on Jan. 27, 2021, now Pat. No. 11,621,169.

(30) Foreign Application Priority Data

Jan. 30, 2020 (JP) .................. 2020-013676

(51) Int. Cl.
*H01L 21/285* (2006.01)
*C23C 16/14* (2006.01)
(Continued)

(52) U.S. Cl.
CPC ........ *H01L 21/28556* (2013.01); *C23C 16/14* (2013.01); *C23C 16/45523* (2013.01);
(Continued)

(58) Field of Classification Search
CPC ......... H01L 21/28556; H01L 21/28562; H01L 21/28568; H01L 21/32051;
(Continued)

(56) References Cited

U.S. PATENT DOCUMENTS 11,056,344 B2 7/2021 Zhu et al.
2010/0297846 A1 11/2010 Kaga et al.
(Continued)

FOREIGN PATENT DOCUMENTS

CN 109427570 A 3/2019
JP 2011-006783 A 1/2011
(Continued)

OTHER PUBLICATIONS

Chinese Office Action issued on Jul. 11, 2023 for Chinese Patent Application No. 202110107065.6.
(Continued)

*Primary Examiner* — Sonya McCall-Shepard
(74) *Attorney, Agent, or Firm* — Volpe Koenig

(57) ABSTRACT

There is provided a technique that includes: (a) supplying a molybdenum-containing gas containing molybdenum and oxygen to a substrate in a process chamber; (b) supplying an additive gas containing hydrogen to the substrate; and (c) supplying a reducing gas containing hydrogen and having a chemical composition different from that of the additive gas to the substrate, wherein at least two of (a), (b), and (c) are performed simultaneously or to partially overlap with each other in time one or more times or (a), (b), and (c) are performed sequentially one or more times to form a molybdenum film on the substrate.

19 Claims, 5 Drawing Sheets

(51) Int. Cl.
    *C23C 16/40*           (2006.01)
    *C23C 16/455*         (2006.01)
    *H01L 21/02*          (2006.01)
    *H01L 21/3205*       (2006.01)
    *H01L 21/67*          (2006.01)

(52) U.S. Cl.
    CPC .. *H01L 21/28568* (2013.01); *H01L 21/32051* (2013.01); *H01L 21/67207* (2013.01)

(58) Field of Classification Search
    CPC ......... H01L 21/02697; H01L 21/02104; H01L 21/0228; H01L 23/53257; H01L 21/28079; H01L 2924/01042; C23C 16/45523; C23C 16/14; C23C 16/405; C23C 16/45527
    See application file for complete search history.

(56) References Cited

U.S. PATENT DOCUMENTS

| | | |
|---|---|---|
| 2014/0370192 A1 | 12/2014 | Odedra et al. |
| 2016/0351402 A1 | 12/2016 | Suzuki et al. |
| 2018/0019165 A1 | 1/2018 | Baum et al. |
| 2019/0067003 A1 | 2/2019 | Zope et al. |
| 2019/0067016 A1 | 2/2019 | Zhu et al. |
| 2020/0194269 A1 | 6/2020 | Ogawa et al. |
| 2020/0258722 A1* | 8/2020 | Natori ............. H10B 41/27 |

FOREIGN PATENT DOCUMENTS

| | | |
|---|---|---|
| JP | 2015-510502 A | 4/2015 |
| JP | 2016-098406 A | 5/2016 |
| JP | 2019-044266 A | 3/2019 |
| JP | 2019-527302 A | 9/2019 |
| WO | 2019/058608 A1 | 3/2019 |

OTHER PUBLICATIONS

Korean Office Action issued on Dec. 8, 2022 for Korean Patent Application No. 10-2021-0011395.
Taiwan Office Action issued on Nov. 11, 2021 for Taiwan Patent Application No. 110102974.
Japanese Office Action issued on Jan. 4, 2022 for Japanese Patent Application No. 2020-013676.
Taiwan Office Action issued on Nov. 1, 2023 for Taiwan Patent Application No. 110102974.

* cited by examiner

METHOD OF PROCESSING SUBSTRATE, METHOD OF MANUFACTURING SEMICONDUCTOR DEVICE, RECORDING MEDIUM, AND SUBSTRATE PROCESSING APPARATUS

CROSS-REFERENCE TO RELATED APPLICATION

This application is a continuation of U.S. patent application Ser. No. 17/159,252, filed on Jan. 27, 2021, which is based upon and claims the benefit of priority from Japanese Patent Application No. 2020-013676, filed on Jan. 30, 2020, the entire contents of which are incorporated herein by reference.

TECHNICAL FIELD

The present disclosure relates to a method of manufacturing a semiconductor device, a recording medium, and a substrate processing apparatus.

BACKGROUND

In the related art, for example, a tungsten (W) film is used to form a control gate of a NAND flash memory with a three-dimensional structure, and a tungsten hexafluoride (WF6) gas containing W is used to form the W film. Further, a titanium nitride (TiN) film may be formed as a barrier film between the W film and an insulating film. The TIN film plays a role of enhancing adhesion between the W film and the insulating film and also plays a role of preventing fluorine (F) contained in the W film from diffusing into the insulating film, and the TiN film is generally formed by using a titanium tetrachloride (TiCl$_4$) gas and an ammonia (NH$_3$) gas.

However, since it is difficult to perform etching due to an increase in the number of layers of the NAND flash memory with the three-dimensional structure, thinning a word line has become a challenge. Instead of using the TiN film and the W film as described above, a molybdenum (Mo) film containing molybdenum (Mo) may be used to reduce a thickness and a resistance of the word line. However, when a Mo precursor gas and a reducing gas such as a hydrogen (H$_2$) gas are used to form the Mo film, chlorine (Cl$_2$) or hydrochloric acid (HCl), which is a factor of inhibiting film formation, is generated as by-products.

SUMMARY

Some embodiments of the present disclosure provide a technique capable of reducing the factor of inhibiting formation of a molybdenum film.

According to embodiments of the present disclosure, there is provided a technique that includes: (a) supplying a molybdenum-containing gas containing molybdenum and oxygen to a substrate in a process chamber; (b) supplying an additive gas containing hydrogen to the substrate; and (c) supplying a reducing gas containing hydrogen and having a chemical composition different from that of the additive gas to the substrate, wherein at least two of (a), (b), and (c) are performed simultaneously or to partially overlap with each other in time one or more times or (a), (b), and (c) are performed sequentially one or more times to form a molybdenum film on the substrate.

DETAILED DESCRIPTION

Embodiments

Figure 1:
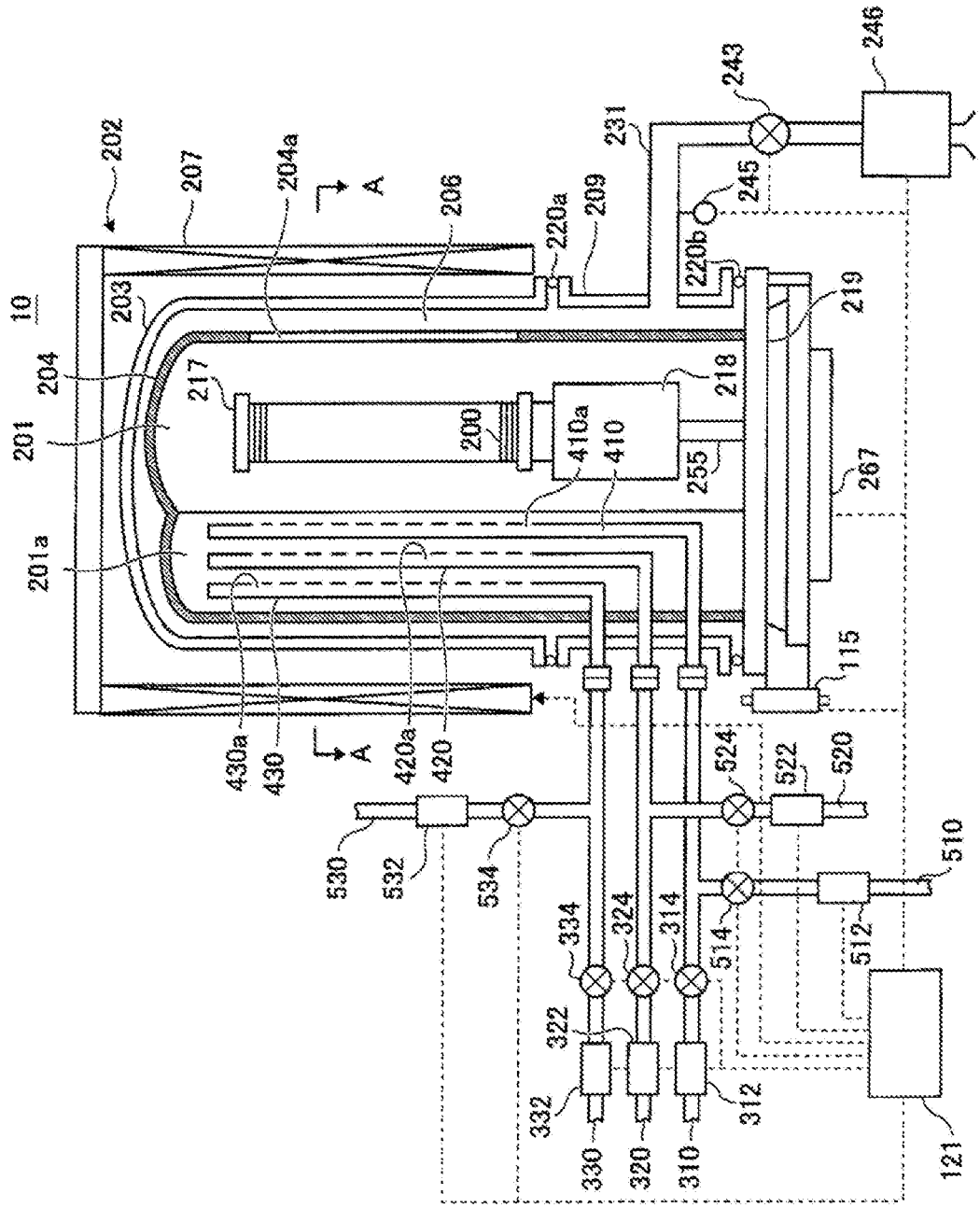
FIG. 1 is a longitudinal cross-sectional view illustrating an outline of a vertical process furnace of a substrate processing apparatus according to embodiments of the present disclosure.

Embodiments of the present disclosure will now be described with reference to FIGS. 1 to 4.

(1) Configuration of Substrate Processing Apparatus

A substrate process apparatus 10 includes a process furnace 202 in which a heater 207 as a heating means (a heating mechanism or a heating system) is installed. The heater 207 has a cylindrical shape and is supported by a heat base (not shown) as a holding plate to be vertically installed.

An outer tube 203 forming a reaction container (process container) is disposed inside the heater 207 to be concentric with the heater 207. The outer tube 203 is made of, for example, a heat resistant material such as quartz (SiO$_2$) or silicon carbide (SIC) and has a cylindrical shape with its upper end closed and its lower end opened. A manifold (inlet flange) 209 is disposed below the outer tube 203 to be concentric with the outer tube 203. The manifold 209 is made of, for example, a metal material such as stainless steel (SUS) and is formed in a cylindrical shape with its upper and lower ends opened. An O-ring 220a serving as a sealing member is installed between an upper end portion of the manifold 209 and the outer tube 203. When the manifold 209 is supported by the heater base, the outer tube 203 is in a state of being installed vertically.

An inner tube 204 forming the reaction container is disposed inside the outer tube 203. The inner tube 204 is made of, for example, a heat resistant material such as quartz (SiO$_2$) or silicon carbide (SIC) and is formed in a cylindrical shape with it upper end closed and its lower end opened. The process container (reaction container) mainly includes the outer tube 203, the inner tube 204, and the manifold 209. A process chamber 201 is formed in a hollow cylindrical portion (inside the inner tube 204) of the process container.

The process chamber 201 is configured to be capable of accommodating wafers 200 as substrates in a state where the wafers 200 are arranged in a horizontal posture and in multiple stages along a vertical direction by a boat 217 to be described below.

Nozzles 410, 420, and 430 are installed in the process chamber 201 to penetrate a sidewall of the manifold 209 and the inner tube 204. Gas supply pipes 310, 320, and 330 are connected to the nozzles 410, 420, and 430, respectively. However, the process furnace 202 of the embodiments of the present disclosure is not limited to the above-described embodiments.

Mass flow controllers (MFCs) 312, 322, and 332, which are flow rate controllers (flow rate control parts), are installed at the gas supply pipes 310, 320, and 330 sequentially from corresponding upstream sides respectively. Further, valves 314, 324, and 334, which are opening/closing valves, are installed at the gas supply pipes 310, 320, and 330 respectively. Gas supply pipes 510, 520, and 530 configured to supply an inert gas are connected to the gas supply pipes 310, 320, and 330, respectively, at the downstream side of the valves 314, 324, and 334. MFCs 512, 522, and 532, which are flow rate controllers (flow rate control parts), and valves 514, 524, and 534, which are opening/closing valves, are installed at the gas supply pipes 510, 520, and 530 sequentially from corresponding upstream sides, respectively.

The nozzles 410, 420, and 430 are connected to leading ends of the gas supply pipes 310, 320, and 330, respectively. The nozzles 410, 420, and 430 are configured as L-shaped nozzles, and have horizontal portions formed to penetrate the sidewall of the manifold 209 and the inner tube 204. Vertical portions of the nozzles 410, 420, and 430 are formed inside a channel-shaped (groove-shaped) preliminary chamber 201a formed to protrude outward in the radial direction of the inner tube 204 and extend in the vertical direction thereof, and are also formed in the preliminary chamber 201a toward an upper side (an upper side in an arrangement direction of the wafers 200) along the inner wall of the inner tube 204.

The nozzles 410, 420, and 430 are installed to extend from a lower region of the process chamber 201 to an upper region of the process chamber 201, and a plurality of gas supply holes 410a, 420a, and 430a are formed at positions facing the wafers 200, respectively. Thus, a process gas is supplied from the gas supply holes 410a, 420a, and 430a of the respective nozzles 410, 420, and 430 to the wafers 200. The gas supply holes 410a, 420a, and 430a are formed from a lower portion to an upper portion of the inner tube 204 and have the same aperture area at the same aperture pitch. However, the gas supply holes 410a, 420a, and 430a are not limited to the above-described form. For example, the aperture area may be gradually increased from the lower portion to the upper portion of the inner tube 204. This makes it possible to make the flow rate of the process gas supplied from the gas supply holes 410a, 420a, and 430a more uniform.

The gas supply holes 410a, 420a, and 430a of the nozzles 410, 420, and 430 are formed at height positions from a lower portion to an upper portion of the boat 217 to be described below. Therefore, the process gas supplied into the process chamber 201 from the gas supply holes 410a, 420a, and 430a of the nozzles 410, 420, and 430 is supplied to the entire region of the wafers 200 accommodated from the lower portion to the upper portion of the boat 217. The nozzles 410, 420, and 430 are installed to extend from the lower region to the upper region of the process chamber 201, but may be installed to extend to the vicinity of a ceiling of the boat 217.

As a precursor gas, a molybdenum-containing gas containing molybdenum (Mo) is supplied from the gas supply pipe 310 into the process chamber 201 via the MFC 312, the valve 314, and the nozzle 410. For example, a molybdenum dichloride dioxide ($MoO_2Cl_2$) containing molybdenum (Mo), oxygen (O), and chlorine (Cl) which is a halogen element, is used as the molybdenum-containing gas.

An additive gas to be added to the precursor gas is supplied from the gas supply pipe 320 into the process chamber 201 via the MFC 322, the valve 324, and the nozzle 420. A monosilane ($SiH_4$) gas containing hydrogen (H) may be used as the additive gas. The $SiH_4$ gas acts as a reducing agent.

A reducing gas that reduces the precursor gas is supplied from the gas supply pipe 330 into the process chamber 201 via the MFC 332, the valve 334, and the nozzle 430. For example, a hydrogen ($H_2$) gas containing hydrogen (H) and having a chemical composition different from that of the additive gas may be used as the reducing gas.

An inert gas, for example, a nitrogen ($N_2$) gas, is supplied from the gas supply pipes 510, 520, and 530 from the process chamber 201 via the MFCs 512, 522, and 532, the valves 514, 524, and 534, and the nozzles 410, 420, and 430, respectively. Hereinafter, an example in which the $N_2$ gas is used as the inert gas will be described. However, as the inert gas, in addition to the $N_2$ gas, for example, a rare gas such as an argon (Ar) gas, a helium (He) gas, a neon (Ne) gas, a xenone (Xe), or the like may be used.

The process gas supply system mainly includes the gas supply pipes 310, 320, and 330, the MFCs 312, 322, and 332, the valves 314, 324, and 334, and the nozzles 410, 420, and 430. However, only the nozzles 410, 420, and 430 may be regarded as the process gas supply system. When the precursor gas flows from the gas supply pipe 310, the precursor gas supply system mainly includes the gas supply pipe 310, the MFC 312, and the valve 314. However, the precursor gas supply system may include the nozzle 410. Further, when the additive gas flows from the gas supply pipe 320, an additive gas supply system mainly includes the gas supply pipe 320, the MFC 322, and the valve 324. However, the additive gas supply system may include the nozzle 420. Further, when the reducing gas flows from the gas supply pipe 330, a reducing gas supply system mainly includes the gas supply pipe 330, the MFC 332, and the valve 334. However, the reducing gas supply system may include the nozzle 430. Further, an inert gas supply system mainly includes the gas supply pipes 510, 520, and 530, the MFCs 512, 522, and 532, and the valves 514, 524, and 534.

A method of supplying a gas in the embodiments of the present disclosure is to transfer a gas via the nozzles 410, 420, and 430 arranged in the preliminary chamber 201a in a vertically long annular space defined by the inner wall of the inner tube 204 and ends of a plurality of wafers 200. Then, the gas is ejected into the inner tube 204 from the plurality of gas supply holes 410a, 420a, and 430a formed at positions of the nozzles 410, 420, and 430, which face the wafers. More specifically, the process gas or the like is ejected toward a direction parallel to the surface of the wafers 200 by the gas supply hole 410a of the nozzle 410, the gas supply hole 420a of the nozzle 420, and the gas supply hole 430a of the nozzle 430.

An exhaust hole (exhaust port) 204a is a through-hole formed in a sidewall of the inner tube 204 at a position facing the nozzles 410, 420, and 430. For example, the exhaust hole 204a is a slit-shaped through-hole formed elongated in the vertical direction. A gas supplied into the process chamber 201 from the gas supply holes 410a, 420a, and 430a of the nozzles 410, 420, and 430 and flowing on the surface of the wafers 200 passes through the exhaust hole 204a and flows into an exhaust passage 206 including a gap formed between the inner tube 204 and the outer tube 203. Then, the gas having flowed through the exhaust passage 206 flows into an exhaust pipe 231 and is discharged to an outside of the process furnace 202.

The exhaust hole 204a is formed at a position facing the plurality of wafers 200, and a gas supplied from the gas supply holes 410a, 420a, and 430a to the vicinity of the wafers 200 in the process chamber 201 flows toward the horizontal direction and then flows into the exhaust passage 206 via the exhaust hole 204a. The exhaust hole 204a is not limited to the slit-shaped through-hole, but may be configured by a plurality of holes.

The exhaust pipe 231 configured to exhaust an internal atmosphere of the process chamber 201 is installed at the manifold 209. A pressure sensor 245, which is a pressure detector (pressure detecting part) configured to detect an internal pressure of the process chamber 201, an auto pressure controller (APC) valve 243, and a vacuum pump 246 as a vacuum-exhausting device are connected to the exhaust pipe 231 sequentially from the upstream side. The APC valve 243 may perform or stop a vacuum-exhausting operation in the process chamber 201 by opening or closing the valve while the vacuum pump 246 is actuated, and may also regulate the internal pressure of the process chamber 201 by adjusting an opening degree of the valve while the vacuum pump 246 is actuated. An exhaust system mainly includes the exhaust hole 204a, the exhaust passage 206, the exhaust pipe 231, the APC valve 243, and the pressure sensor 245. The exhaust system may include the vacuum pump 246.

A seal cap 219 serving as a furnace opening lid configured to be capable of hermetically sealing a lower end opening of the manifold 209 is installed under the manifold 209. The seal cap 219 is configured to come into contact with the lower end of the manifold 209 from the lower side in the vertical direction. The seal cap 219 is made of, for example, a metal material such as stainless steel (SUS), and is formed in a disc shape. An O-ring 220b as a seal member making contact with the lower end of the manifold 209 is installed on an upper surface of the seal cap 219. A rotation mechanism 267 configured to rotate the boat 217 in which the wafers 200 are accommodated is installed on the opposite side of the process chamber 201 in the seal cap 219. A rotary shaft 255 of the rotation mechanism 267 penetrates the seal cap 219 and is connected to the boat 217. The rotation mechanism 267 is configured to rotate the wafers 200 by rotating the boat 217. The seal cap 219 is configured to be vertically moved up or down by a boat elevator 115 as an elevation mechanism vertically installed outside the outer tube 203. The boat elevator 115 is configured to be capable of loading/unloading the boat 217 into/out of the process chamber 201 by moving the seal cap 219 up or down. The boat elevator 115 is configured as a transfer device (transfer mechanism) configured to transfer the boat 217 and the wafers 200 accommodated in the boat 217 into/out of the process chamber 201.

The boat 217 serving as a substrate support is configured to arrange a plurality of wafers 200, for example, 25 to 200 wafers 200, in a horizontal posture at intervals in the vertical direction with the centers of the wafers 200 aligned with one another. The boat 217 is made of, for example, a heat resistant material such as quartz or SiC. Heat insulating plates 218 made of, for example, a heat resistant material such as quartz or SiC, are supported in a horizontal posture and in multiple stages (not shown) below the boat 217. This configuration makes it difficult to transfer heat from the heater 207 to the seal cap 219 side. However, the embodiments of the present disclosure are not limited to the above-described form. For example, instead of the heat insulating plates 218 being installed below the boat 217, a heat insulating cylinder configured as a cylindrical member made of a heat resistant material such as quartz or SiC may be installed below the boat 217.

Figure 2:
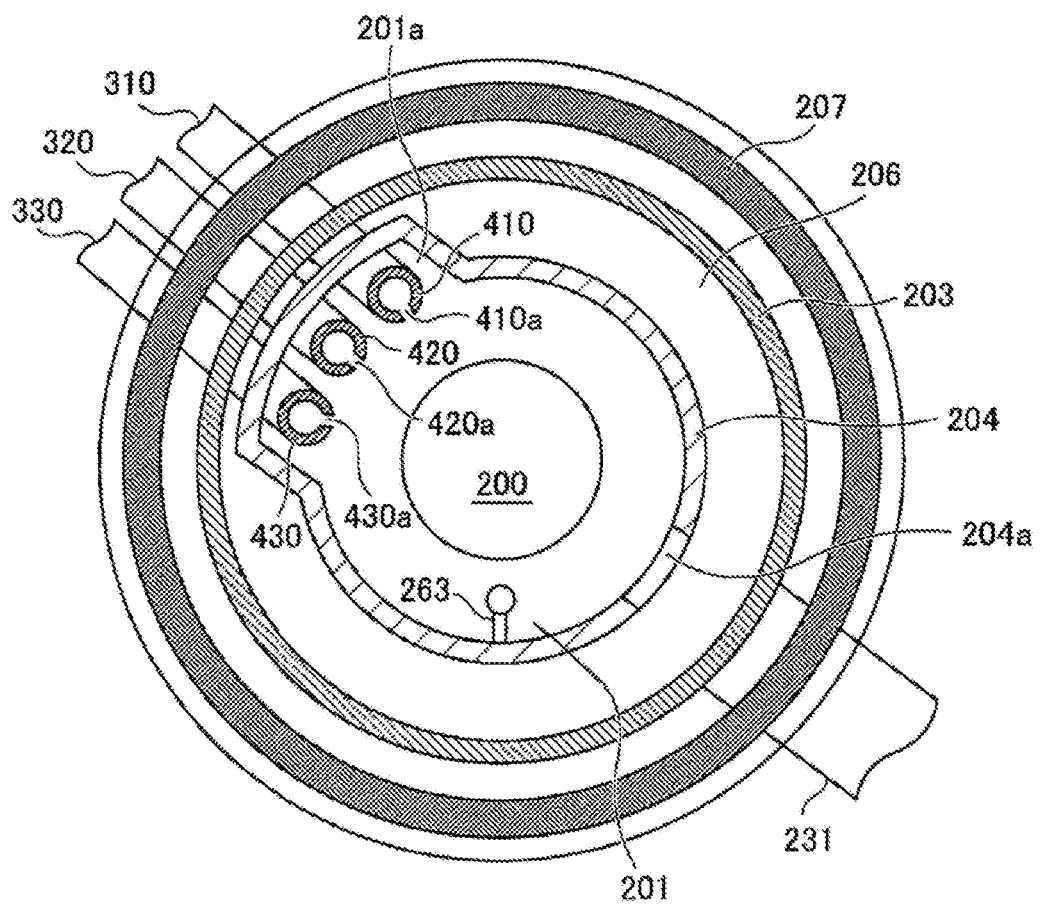
FIG. 2 is a schematic cross-sectional view taken along a line A-A in FIG. 1.

As shown in FIG. 2, a temperature sensor 263 serving as a temperature detector is installed in the inner tube 204. Based on temperature information detected by the temperature sensor 263, an amount of electric currents supplied to the heater 207 is regulated such that an interior of the process chamber 201 has a desired temperature distribution. The temperature sensor 263 is configured as an L-shape, like the nozzles 410, 420, and 430, and is installed along the inner wall of the inner tube 204.

Figure 3:
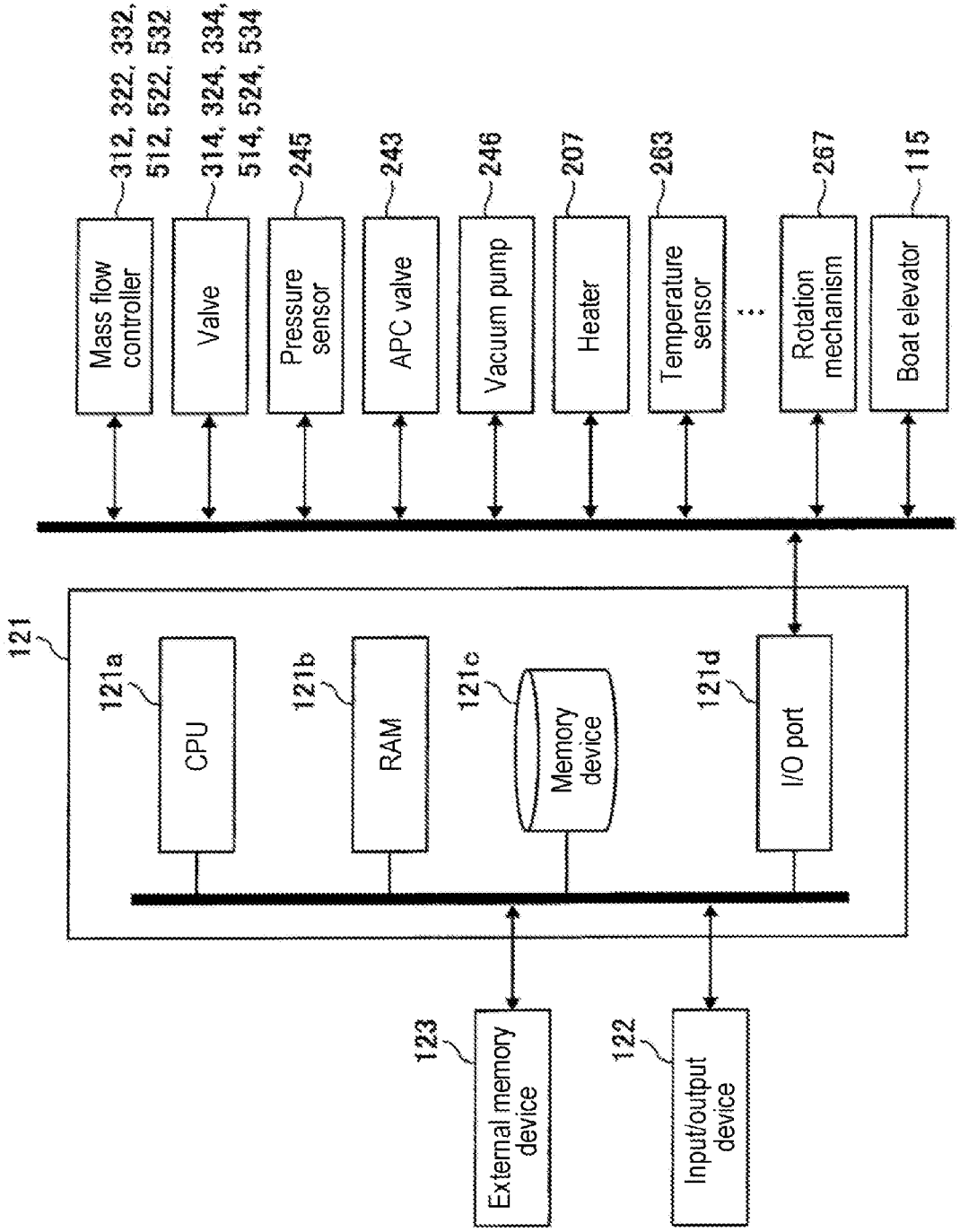
FIG. 3 is a schematic configuration diagram of a controller of a substrate processing apparatus according to embodiments of the present disclosure, in which a control system of the controller is illustrated in a block diagram.

As shown in FIG. 3, a controller 121, which is a control part (control means), may be configured as a computer including a central processing unit (CPU) 121a, a random access memory (RAM) 121b, a memory device 121c, and an I/O port 121d. The RAM 121b, the memory device 121c, and the I/O port 121d are configured to be capable of exchanging data with the CPU 121a via an internal bus. An input/output device 122 formed of, for example, a touch panel or the like, is connected to the controller 121.

The memory device 121c includes, for example, a flash memory, a hard disk drive (HDD), or the like. A control program that controls operations of a substrate processing apparatus and a process recipe, in which sequences and conditions of a method of manufacturing a semiconductor device to be described below, and the like are written, are readably stored in the memory device 121c. The process recipe functions as a program configured to cause the controller 121 to execute each process (each step) in the method of manufacturing a semiconductor device to be described below, to obtain a predetermined result. Hereinafter, the process recipe and the control program may be generally and simply referred to as a "program." When the term "program" is used herein, it may indicate a case of including the process recipe only, a case of including the control program only, or a case of including both the process recipe and the control program. The RAM 121b is configured as a memory area (work area) in which a program or data read by the CPU 121a is temporarily stored.

The I/O port 121d is connected to the MFCs 312, 322, 332, 512, 522, and 532, the valves 314, 324, 334, 514, 524, and 534, the pressure sensor 245, the APC valve 243, the vacuum pump 246, the heater 207, the temperature sensor 263, the rotation mechanism 267, the boat elevator 115, and the like.

The CPU 121a is configured to read and execute the control program from the memory device 121c. The CPU 121a also reads the recipe and the like from the memory device 121c according to an input of an operation command and the like from the input/output device 122. The CPU 121a is configured to control the flow rate regulating operation of various kinds of gases by the MFCs 312, 322, 332, 512, 522, and 532, the opening/closing operation of the valves 314, 324, 334, 514, 524, and 534, the opening/closing operation of the APC valve 243, the pressure regulating operation performed by the APC valve 243 based on the pressure sensor 245, the temperature regulating operation performed by the heater 207 based on the temperature sensor 263, the actuating and stopping of the vacuum pump 246, the operation of rotating the boat 217 with the rotation mechanism 267 and adjusting the rotation speed of the boat 217, the operation of moving the boat 217 up or down by the boat elevator 115, the operation of accommodating the wafers 200 in the boat 217, and the like, according to contents of the read recipe.

The controller 121 may be configured by installing, on the computer, the aforementioned program stored in an external memory device (for example, a magnetic tape, a magnetic disk such as a flexible disk or a hard disk, an optical disc such as a CD or a DVD, a magneto-optical disc such as an MO, a semiconductor memory such as a USB memory or a memory card, and the like) 123. The memory device 121c and the external memory device 123 are configured as a computer-readable recording medium. Hereinafter, the memory device 121c and the external memory device 123 may be generally and simply referred to as a "recording medium." When the term "recording medium" is used herein, it may indicate a case of including the memory device 121c only, a case of including the external memory device 123 only, or a case of including both the memory device 121c and the external memory device 123. Furthermore, the program may be provided to the computer by using a communication means such as the Internet or a dedicated line, instead of using the external memory device 123.

(2) Substrate Processing Process (Film-Forming Process)

As a process of manufacturing a semiconductor device, an example of a process of forming a molybdenum (Mo) film, which is an example of a metal film forming a gate electrode, on the wafer 200 will be described with reference to FIG. 4. The process of forming the Mo film is performed by using the process furnace 202 of the above-described substrate processing apparatus 10. In the following description, operations of various parts constituting the substrate processing apparatus 10 are controlled by the controller 121.

A substrate processing process (a process of manufacturing a semiconductor device) according to embodiments of the present disclosure includes: (a) a step of supplying a Mo-containing gas containing Mo and O to a wafer 200 in a process chamber 201; (b) a step of supplying a $SiH_4$ gas, which is an additive gas containing H, to the wafer 200; and (c) a step of supplying a $H_2$ gas, which is a reducing gas containing H and having a chemical composition different from that of the additive gas, to the wafer 200 (c), wherein at least two of the steps (a), (b), and (c) are performed simultaneously or to partially overlap with each other in time or (a), (b), and (c) are performed sequentially and alternately to form a Mo film on the wafer.

When the term "wafer" is used in the present disclosure, it may refer to "a wafer itself" or "a wafer and a laminated body of a certain layer, a film, and the like formed on a surface of a wafer." When the phrase "a surface of a wafer" is used in the present disclosure, it may refer to "a surface of a wafer itself" or "a surface of a certain layer, a film, and the like formed on a wafer". When the term "substrate" is used in the present disclosure, it may be synonymous with the term "wafer."

(Wafer Loading)

A plurality of wafers 200 are charged on the boat 217 (wafer charging). Then, as shown in FIG. 1, the boat 217 supporting the plurality of wafers 200 is lifted up by the boat elevator 115 and is loaded into the process chamber 201 (boat loading). In this state, the seal cap 219 seals the lower end of the outer tube 203 via the O-ring 220b.

(Pressure Regulation and Temperature Regulation)

The interior of the process chamber 201 is vacuum-exhausted by the vacuum pump 246 to reach a desired pressure (degree of vacuum). In this operation, the internal pressure of the process chamber 201 is measured by the pressure sensor 245. The APC valve 243 is feedback-controlled based on the measured pressure information (pressure regulation). The vacuum pump 246 is constantly operated at least until processing on the wafers 200 is completed. The interior of the process chamber 201 is heated by the heater 207 to a desired processing temperature. At this time, an amount of electric currents supplied to the heater 207 is feedback-controlled based on the temperature information detected by the temperature sensor 263 such that the interior of the process chamber 201 has a desired temperature distribution (temperature regulation). Heating the interior of the process chamber 201 by the heater 207 may be continuously performed at least until the processing on the wafers 200 is completed.

[First Step] ($MoO_2Cl_2$ Gas Supply)

The valve 314 is opened to allow a $MoO_2Cl_2$ gas, which is a precursor gas and contains Mo and O, to flow into the gas supply pipe 310. The flow rate of the $MoO_2Cl_2$ gas is regulated by the MFC 312, and the $MoO_2Cl_2$ gas is supplied into the process chamber 201 from the gas supply hole 410a of the nozzle 410 and is exhausted via the exhaust pipe 231. In this operation, the $MoO_2Cl_2$ gas is supplied to a wafer 200. At the same time, the valve 514 is opened to allow an inert gas such as a $N_2$ gas to flow into the gas supply pipe 510. A flow rate of the $N_2$ gas flowing through the gas supply pipe 510 is regulated by the MFC 512, and the $N_2$ gas is supplied into the process chamber 201 together with the $MoO_2Cl_2$ gas and is exhausted via the exhaust pipe 231. At this time, the valves 524 and 534 are opened to allow a $N_2$ gas to flow into the gas supply pipes 520 and 530, thereby preventing the $MoO_2Cl_2$ gas from infiltrating into the nozzles 420 and 430. The $N_2$ gas is supplied into the process chamber 201 via the gas supply pipes 320 and 330 and the nozzles 420 and 430 and is exhausted via the exhaust pipe 231.

At this time, the APC valve 243 is regulated such that the internal pressure of the process chamber 201 is within the range of, for example, 1 to 3,990 Pa, for example, 1,000 Pa. The supply flow rate of the $MoO_2Cl_2$ gas controlled by the MFC 312 is within the range of, for example, 0.1 to 1.0 slm, specifically 0.1 to 0.3 slm. The supply flow rate of the $N_2$ gas controlled by the MFCs 512, 522, and 532 is within the range of, for example, 0.1 to 20 slm. At this time, the temperature of the heater 207 is set to a temperature such that the temperature of the wafer 200 is within the range of, for example, 300 to 600 degrees C.

At this time, only the $MoO_2Cl_2$ gas and the $N_2$ gas flow through the process chamber 201. By supplying the $MoO_2Cl_2$ gas, a Mo-containing layer is formed on the wafer 200 (a base film on a surface thereof). The Mo-containing layer may be a Mo layer containing Cl or O, an adsorption layer of $MoO_2Cl_2$, or both of them.

($SiH_4$ Gas Supply)

After a lapse of a predetermined time from the start of supply of the $MoO_2Cl_2$ gas, for example, 0.01 to 5 seconds later, the valve 324 is opened to allow a $SiH_4$ gas, which is an additive gas containing H, to flow through the gas supply pipe 320. A flow rate of the $SiH_4$ gas is regulated by the MFC 322, and the $SiH_4$ gas is supplied into the process chamber 201 from the gas supply hole 420a of the nozzle 420 and is exhausted via the exhaust pipe 231. At the same time, the valve 524 is opened to allow an inert gas such as a $N_2$ gas to flow through the gas supply pipe 520. A flow rate of the $N_2$ gas flowing through the gas supply pipe 520 is regulated by the MFC 522, and the $N_2$ gas is supplied into the process chamber 201 together with the $SiH_4$ gas and is exhausted via the exhaust pipe 231. At this time, the valve 534 is opened to allow a $N_2$ gas to flow through the gas supply pipe 530 to prevent the $MoO_2Cl_2$ gas and the $SiH_4$ gas from infiltrating into the nozzle 430. The $N_2$ gas is supplied into the process chamber 201 via the gas supply pipe 330 and the nozzle 430 and is exhausted via the exhaust pipe 231. In this operation, the $MoO_2Cl_2$ gas, the $SiH_4$ gas, and the $N_2$ gas are simultaneously supplied to the wafer 200. That is, there is a timing when at least the $MoO_2Cl_2$ gas and the $SiH_4$ gas are supplied in parallel at the same time, and there is a timing when at least the $MoO_2Cl_2$ gas and the $SiH_4$ gas are supplied to partially overlap with each other. By providing the timing of supplying at least the $MoO_2Cl_2$ gas and the $SiH_4$ gas in parallel, it is possible to adsorb Mo while removing Cl that inhibits the adsorption of Mo.

At this time, the APC valve 243 is regulated such that the internal pressure of the process chamber 201 is within the range of, for example, 130 to 3,990 Pa, for example, 1,000 Pa. The supply flow rate of the $SiH_4$ gas controlled by the MFC 322 is within the range of, for example, 0.1 to 10 slm, specifically 0.5 to 2 slm. The supply flow rate of the $N_2$ gas controlled by the MFCs 512, 522, and 532 is, for example, 0.01 to 20 slm, specifically 0.1 to 10 slm, more specifically 0.1 to 1 slm. At this time, the temperature of the heater 207 is set to, for example, 475 degrees C. When the internal temperature of the process chamber 201 is 550 degrees C. or higher, a content of Si in a Mo film formed by the supply of the SiHA gas increases, which may result in a MoSi film. In addition, Cl and HCl may not be completely removed, which may result in the decrease in deposition rate. By lowering the internal temperature of the process chamber 201 below 550 degrees C., Cl and HCl can be removed from the Mo-containing layer without containing Si.

After a lapse of a predetermined time from the start of supply of the $MoO_2Cl_2$ gas, for example, 0.01 to 10 seconds later, the valve 314 of the gas supply pipe 310 is closed to stop the supply of the $MoO_2Cl_2$ gas. That is, time during which the $MoO_2Cl_2$ gas is supplied to the wafer 200 is within the range of, for example, 0.01 to 10 seconds. At this time, the valves 514 and 534 are opened to allow a $N_2$ gas to flow through the gas supply pipes 510 and 530 to prevent the $SiH_4$ gas from infiltrating into the nozzles 410 and 430. The $N_2$ gas is supplied into the process chamber 201 via the gas supply pipes 310 and 330 and the nozzles 410 and 430 and is exhausted via the exhaust pipe 231. In this operation, the $SiH_4$ gas and the $N_2$ gas are supplied to the wafer 200.

[Second Step (First Purging Step)] (Removal of Residual Gas)

After a lapse of a predetermined time from the start of supply of the $SiH_4$ gas, for example, 0.01 to 60 seconds later, specifically 0.1 to 30 seconds later, more specifically 1 to 20 seconds later, the valve 324 is closed to stop the supply of the $SiH_4$ gas. That is, time during which the $SiH_4$ gas is supplied to the wafer 200 is within the range of, for example, 0.01 to 60 seconds, specifically 0.1 to 30 seconds, more specifically 1 to 20 seconds. That is, the supply of the $MoO_2Cl_2$ gas is started in a state where the $SiH_4$ gas is not supplied to the wafer 200, and the supply of the $MoO_2Cl_2$ gas is stopped while the $SiH_4$ gas is being supplied to the wafer 200. At this time, with the APC valve 243 of the exhaust pipe 231 left open, the interior of the process chamber 201 is vacuum-exhausted by the vacuum pump 246 to remove an unreacted $MoO_2Cl_2$ gas and $SiH_4$ gas or the $MoO_2Cl_2$ gas and $SiH_4$ gas after contributing to the formation of the Mo-containing layer, which remain in the process chamber 201, from the process chamber 201. That is, the interior of the process chamber 201 is purged. At this time, with the valves 514, 524, and 534 left open, the supply of the $N_2$ gas into the process chamber 201 is maintained. The $N_2$ gas acts as a purge gas to further remove the unreacted $MoO_2Cl_2$ gas and $SiH_4$ gas or the $MoO_2Cl_2$ gas and $SiH_4$ gas after contributing to the formation of the Mo-containing layer, which remain in the process chamber 201, from the process chamber 201. Here, Cl and HCl, which are the growth-inhibiting factors, react with $SiH_4$ to be desorbed from the Mo-containing layer and are discharged as silicon tetrachloride ($SiCl_4$) and hydrogen ($H_2$) from the process chamber 201. Cl and HCl inhibit adsorption of Mo and become a factor of lowering a deposition rate. By supplying the $SiH_4$ gas, which is an additive gas, Cl and HCl are desorbed and removed from the Mo-containing layer before supplying a $H_2$ gas, which is a reducing gas to be described below, such that Mo adsorption sites in one cycle may be increased. Here, an example in which the first purging step is started after the supply of the $SiH_4$ gas is stopped is shown. However, the present disclosure is not limited thereto, and the first purging step may be performed after the supply of the $MoO_2Cl_2$ gas is stopped.

[Third Step] ($H_2$ Gas Supply)

After the residual gas in the process chamber 201 is removed, the valve 334 is opened to allow a $H_2$ gas, which is a reducing gas containing H and having a chemical composition different from that of the additive gas, to flow through the gas supply pipe 330. A flow rate of the $H_2$ gas is regulated by the MFC 332, and the $H_2$ gas is supplied into the process chamber 201 from the gas supply hole 430a of the nozzle 430 and is exhausted via the exhaust pipe 231. In this operation, the $H_2$ gas is supplied to the wafer 200. At the same time, the valve 534 is opened to allow a $N_2$ gas to flow through the gas supply pipe 530. A flow rate of the $N_2$ gas having flowed through the gas supply pipe 530 is regulated by the MFC 532. The $N_2$ gas is supplied into the process chamber 201 together with the $H_2$ gas and is exhausted via the exhaust pipe 231. At this time, the valves 514 and 524 are opened to allow a $N_2$ gas to flow through the gas supply pipes 510 and 520 to prevent the $H_2$ gas from infiltrating into the nozzles 410 and 420. The $N_2$ gas is supplied into the process chamber 201 via the gas supply pipes 310 and 320 and the nozzles 410 and 420 and is exhausted via the exhaust pipe 231.

At this time, the APC valve 243 is regulated such that the internal pressure of the process chamber 201 is within the range of, for example, 1 to 3,990 Pa, for example, 2,000 Pa. The supply flow rate of the $H_2$ gas controlled by the MFC 332 is within the range of, for example, 1 to 50 slm, specifically 15 to 30 slm. The supply flow rate of the $N_2$ gas controlled by the MFCs 512, 522, and 532 is within the range of, for example, 0.1 to 30 slm. Time during which the $H_2$ gas is supplied to the wafer 200 is within the range of, for example, 0.01 to 30 seconds. A temperature of the heater 207 at this time is set to the same temperature as that of the $SiH_4$ gas supply step.

At this time, only the $H_2$ gas and the $N_2$ gas are flowing through the process chamber 201. The $H_2$ gas makes a substitution reaction with at least a portion of the Mo-containing layer formed on the wafer 200 in the first step. That is, O in the Mo-containing layer reacts with $H_2$ to be desorbed from the Mo-containing layer and be discharged as water vapor ($H_2O$) from the process chamber 201. Time in this third step can be shorter than the time when the supply of the $SiH_4$ gas, which is an additive gas, is not executed in the above-described first step. Further, a total of a supply time of the $SiH_4$ gas as the additive gas and a supply time of the $H_2$ gas as the reducing gas is set to be a predetermined time. That is, the supply time of the reducing gas may be lengthened when the supply time of the additive gas is shortened, and the supply time of the reducing gas may be shortened when the supply time of the additive gas is lengthened. Then, a Mo layer containing Mo and substantially not containing Cl and O is formed on the wafer 200.

[Fourth Step (Second Purging Step)] (Removal of Residual Gas)

After the Mo layer is formed, the valve 334 is closed to stop the supply of the $H_2$ gas. Then, according to the same processing procedure as in the above-described second step, an unreacted $H_2$ gas or the $H_2$ gas after contributing to the formation of the Mo layer and reaction by-products, which remain in the process chamber 201, are removed from the process chamber 201. That is, the interior of the process chamber 201 is purged.

Here, the supply flow rate of the SiHA gas, which is the additive gas in the first step, is set to be larger than the supply flow rate of the $MoO_2Cl_2$ gas, which is the precursor gas in the first step, and smaller than the supply flow rate of the $H_2$ gas, which is the reducing gas in the third step. The reason why the supply flow rate of the $SiH_4$ gas, which is the additive gas, is set to be larger than the supply flow rate of the $MoO_2Cl_2$ gas, which is the precursor gas, is to cause Cl in the Mo-containing layer to react with $SiH_4$ and to be desorbed and removed from the Mo-containing layer. However, if the supply flow rate of the $SiH_4$ gas is too large, Si contained in the $SiH_4$ gas may enter the Mo-containing layer, and the Mo film formed may contain Si to become a MoSi film. Therefore, the supply flow rate of the $SiH_4$ gas, which is the additive gas, is set to be smaller than that of the $H_2$ gas, which is the reducing gas. That is, it is possible to form a Si-free Mo film while removing Cl. In other words, the $SiH_4$ gas, which is the additive gas, is supplied until HCl and Cl are desorbed and removed from the Mo-containing layer and before O is desorbed from the Mo-containing layer, and the $H_2$ gas, which is the reducing gas, is supplied until O is desorbed and removed from the Mo-containing layer.

Further, the internal pressure of the process chamber 201 when the $SiH_4$ gas, which is the additive gas in the first step, is supplied is set to be equal to the internal pressure of the process chamber 201 when the $MoO_2Cl_2$ gas, which is the precursor gas in the first step, is supplied, and is set to be lower than the internal pressure of the process chamber 201 when the $H_2$ gas, which is the reducing gas in the third step, is supplied.

Further, the purge time in the first purging step, which is the above-described second step, is set to be equal to or less than the purge time in the second purging step, which is the above-described fourth step. That is, the purge time in the second purging step is set to be longer than the purge time in the first purging step. This is because the Mo-containing gas that has not been adsorbed is removed in the first purging step and $H_2O$ and the like, which are produced reaction by-products, are removed in the second purging step.

Further, when $MoO_xCl_y$ is adsorbed on the Mo-containing layer, the adsorption of Mo is inhibited due to the large size of molecules of O and Cl. In other words, a structure such as $MoO_xCl_y$' acts as steric hindrance, reducing adsorption sites on which Mo can be adsorbed. In this case, x and y are, for example, natural numbers. Cl and HCl are desorbed and removed from the Mo-containing layer by the supply of the $SiH_4$ gas, and then O is desorbed and removed from the Mo-containing layer by the supply of the $H_2$ gas, such that the Mo-containing layer may be reduced in two steps to form a Mo film in which Cl and HCl, which are the factors that inhibits film formation, are decreased while the adsorption sites of Mo is increased.

(Performing Predetermined Number of Times)

By performing a cycle one or more times (a predetermined number of times (n times)), the cycle including sequentially performing the described-above first to fourth steps, a Mo film having a predetermined thickness (for example, 0.5 to 5.0 nm) is formed on the wafer 200. The above-mentioned cycle may be performed a plurality of times. That is, by cyclically performing the supply of the $MoO_2Cl_2$ gas as the precursor gas, the supply of the $SiH_4$ gas as the additive gas, and the supply of the $H_2$ gas as the reducing gas, in a pulsed manner, the Mo film having the predetermined thickness is formed on the wafer 200.

(After-Purge and Returning to Atmospheric Pressure)

A $N_2$ gas is supplied into the process chamber 201 from each of the gas supply pipes 510, 520, and 530 and is exhausted via the exhaust pipe 231. The $N_2$ gas acts as a purge gas, whereby the interior of the process chamber 201 is purged with the inert gas to remove a gas and reaction by-products remaining in the process chamber 201 from the process chamber 201 (after-purge). Thereafter, the internal atmosphere of the process chamber 201 is substituted with the inert gas (inert gas substitution), and the internal pressure of the process chamber 201 is returned to the atmospheric pressure (returning to atmospheric pressure).

(Wafer Unloading)

Thereafter, the seal cap 219 is moved down by the boat elevator 115 to open the lower end of the outer tube 203. Then, the processed wafers 200 supported by the boat 217 are unloaded from the lower end of the outer tube 203 to the outside of the outer tube 203 (boat unloading). Then, the processed wafers 200 are discharged from the boat 217 (wafer discharging).

(3) Effects According to the Embodiments

According to the embodiments, one or more effects set forth below may be achieved.

(a) It is possible to form a Mo film in which Cl and HCl, which are the factors of inhibiting film formation, are reduced.

(b) It is possible to increase Mo adsorption sites in one cycle by removing Cl and HCl, which are factors of inhibiting film formation.

(c) It is possible to increase a throughput since a supply time of a reducing gas can be shortened, as compared with a case where an additive gas is not used.

(d) It is possible to improve film characteristics of the Mo film. That is, it is possible to form the Mo film having good step coverage by reducing a content of Cl (concentration of Cl) in the Mo film and lowering a resistivity, as compared with a case where the additive gas is not used.

<Modifications>

Figure 4:
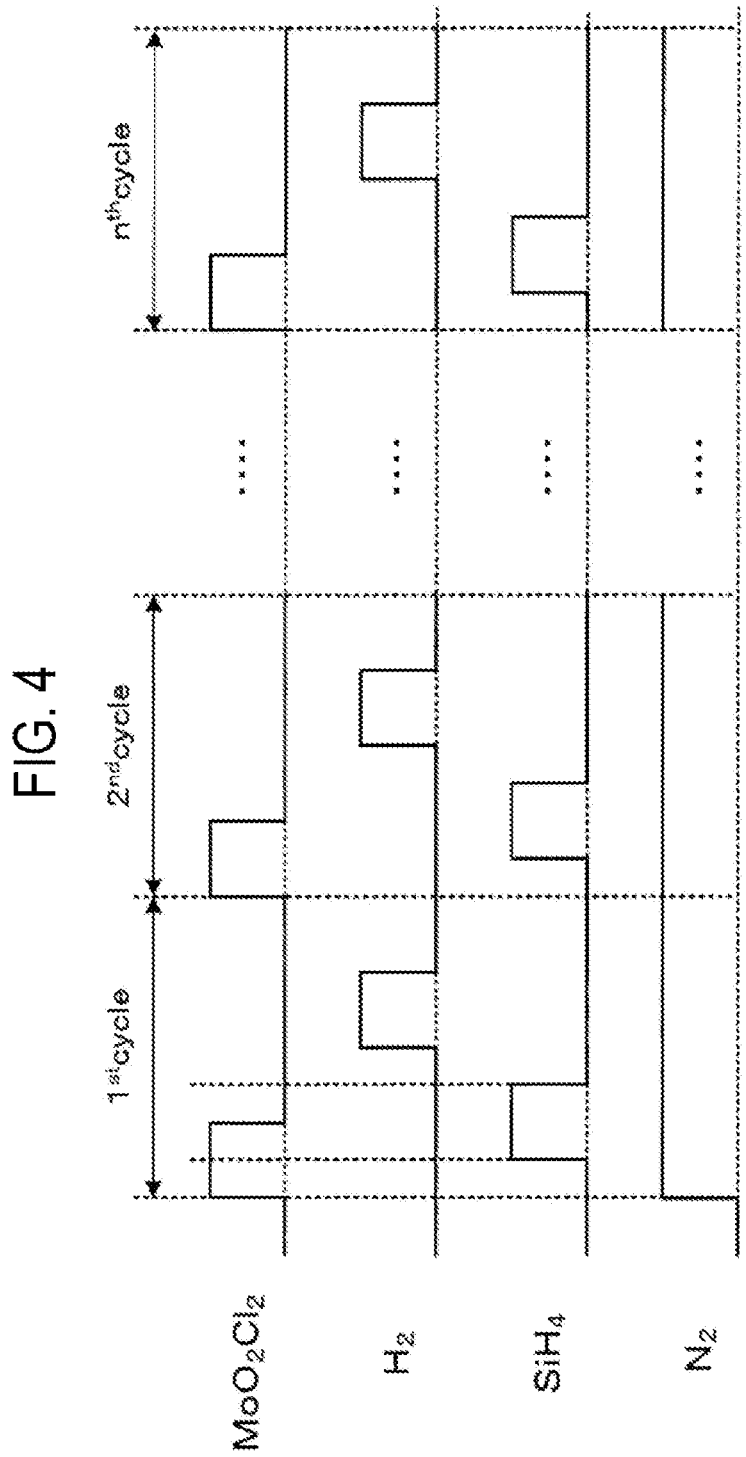
FIG. 4 is a diagram showing timing of gas supply according to embodiments of the present disclosure.
Figure 5:
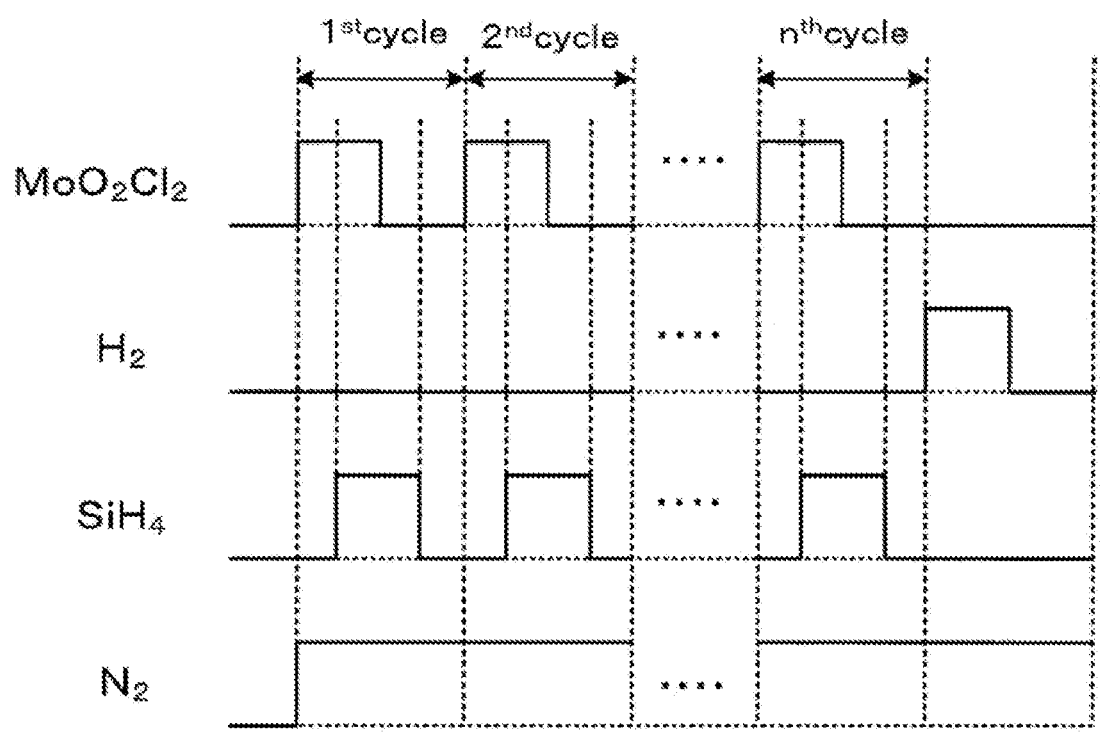
FIG. 5 is a diagram showing a modification of timing of gas supply according to embodiments of the present disclosure.

In a modification of the above-described embodiments of the present disclosure, as shown in FIG. 5, the above-described third and fourth steps are performed after the above-described first and second steps are alternately repeatedly performed one or more times (a predetermined number of times (n times)). That is, the supply of the $H_2$ gas, which is the reducing gas, is performed after the supply of the $MoO_2Cl_2$ gas, which is the precursor gas, and the supply of the $SiH_4$ gas, which is the additive gas, are alternately performed a plurality of times such that the supply of the $MoO_2Cl_2$ gas and the supply of the $SiH_4$ gas partially overlap with each other. That is, the supply of the $H_2$ gas, which is the reducing gas, is performed after the supply of the $MoO_2Cl_2$ gas, which is the precursor gas, and the supply of the $SiH_4$ gas, which is the additive gas, are cyclically performed in a pulsed manner. Even in such a case, since the Mo film in which Cl and HCl, which are the factors of inhibiting film formation, are reduced can be formed on the wafer 200, the same effects as the above-described film-forming sequence shown in FIG. 4 can be obtained.

Further, in the above-described embodiments and modifications, a configuration having a timing at which the supply of the $MoO_2Cl_2$ gas, which is the precursor gas, and the supply of the $SiH_4$ gas, which is the additive gas, partially overlap with each other, has been described. However, the present disclosure is not limited thereto, and the supply of the $MoO_2Cl_2$ gas, which is the precursor gas, and the supply of the $SiH_4$ gas, which is the additive gas, may be performed in parallel at the same time. That is, the $MoO_2Cl_2$ gas supply and the $SiH_4$ gas supply may be started in parallel at the same time and stopped at the same time. That is, the supply of the $H_2$ gas, which is the reducing gas, may be performed after the supply of the $MoO_2Cl_2$ gas, which is the precursor gas, and the supply of the SiHA gas, which is the additive gas, are performed at the same time. By cyclically performing the supply of each gas in a pulsed manner, Mo can be adsorbed while desorbing and removing Cl and HCl that inhibit the adsorption of Mo from the Mo-containing layer, such that a Mo film in which Cl and HCl, which are the factors of inhibiting film formation, are reduced, can be formed on the wafer 200. That is, even in such a case, the same effects as the above-described film-forming sequence shown in FIG. 4 can be obtained.

Further, in the above-described embodiments and modifications, a configuration in which the supply of the $SiH_4$ gas, which is the additive gas, is performed simultaneously or to partially overlap in time with the supply of the $MoO_2Cl_2$ gas, which is the precursor gas, and then the $H_2$ gas, which is the reducing gas, is supplied, has been described. However, the present disclosure is not limited thereto, and the $MoO_2Cl_2$ gas supply, the $SiH_4$ gas supply, and the $H_2$ gas supply may be performed sequentially, and the $H_2$ gas, which is the reducing gas, may be supplied after the $MoO_2Cl_2$ gas supply and the $SiH_4$ gas supply are alternately performed.

Further, in the above-described embodiments and modifications, an example in which the $MoO_2Cl_2$ gas, which is the Mo-containing gas containing Mo and O, is used as the precursor gas has been described. However, the present disclosure is not limited thereto, and a gas such as molybdenum oxytetrachloride ($MoOCl_4$) or molybdenum pentachloride ($MoCl_5$), which is a Mo-containing gas containing Mo and Cl, may be used as the precursor gas.

Further, in the above-described embodiments and modifications, an example in which the $SiH_4$ gas containing H and Si is used as the additive gas has been described. However, the present disclosure is not limited thereto, and a gas such as disilane ($Si_2H_6$) may be used as the additive gas. Further, even when a gas such as an ammonia ($NH_3$) containing H or pyridine ($C_5H_5N$) containing H and C is used as the additive gas, Cl is removed as HCl, and the same effects as the above-described film-forming sequence shown in FIG. 4 may be obtained.

Further, in the above-described embodiments and modifications, an example in which the $H_2$ gas is used as the reducing gas has been described. However, the present disclosure is not limited thereto, and any H-containing gas containing H may be used as the reducing gas.

Further, in the above-described embodiments and modifications, a configuration in which a film is formed by using a batch-type substrate processing apparatus capable of processing a plurality of substrates at a time has been described. However, the present disclosure is not limited thereto, and the present disclosure may be suitably applied to a case where a film is formed by using a single-wafer type substrate processing apparatus capable of processing a single substrate or several substrates at a time.

Although various typical embodiments of the present disclosure have been described above, the present disclosure is not limited to those embodiments, but may be used in proper combination.

Examples will be described below, but the present disclosure is not limited to the examples.

EXAMPLES

In this Example, a Mo film having a film thickness of 200 Å is formed on a wafer by using the timing of gas supply shown in FIG. 4 in the above-described embodiments. That is, supply of the additive gas ($SiH_4$ gas) is performed to partially overlap with supply of the precursor gas ($MoO_2Cl_2$ gas), and then the reducing gas ($H_2$ gas) is supplied. In a Comparative Example, among the gas supplies shown in FIG. 4, the supply of the additive gas ($SiH_4$ gas) is not supplied. Specifically, in the Comparative Example, the $MoO_2Cl_2$ gas supply, the residual gas removal, the $H_2$ gas supply, and the residual gas removal are repeatedly performed to form a Mo film having a thickness of 200 Å on the wafer.

In the Comparative Example, a processing time of a first step in one cycle is 12 seconds, a processing time of a second step is 6 seconds, a processing time of a third step is 24 seconds, and a processing time of a fourth step is 18 seconds, taking 400 minutes to perform 400 cycles to form a Mo film having a thickness of 200 Å. The number of wafers processed per hour is 10.91.

In contrast, in the Example of the present disclosure, a processing time of a first step in one cycle is 12 seconds, a processing time of a second step is 6 seconds, a processing time of a third step is 12 seconds, and a processing time of a fourth step is 18 seconds, taking 320 minutes to perform 400 cycles to form a Mo film having a thickness of 200 Å. Further, the number of wafers processed per hour is 12.77.

That is, in the Example, the supply time of the $H_2$ gas serving as the reducing gas, which is the processing time of the third step in one cycle, may be shortened as compared with the comparative example. That is, in this Example, by supplying the additive gas, the supply time of the reducing gas in one cycle may be shortened to be about half the supply time of the reducing gas in one cycle in the Comparative Example. Therefore, since a film formation time of the Mo film may be shortened, the number of wafers processed per hour may be increased. That is, a throughput may be increased. This may be because HCl and Cl are removed when the $H_2$ gas serving as the reducing gas is supplied such that Mo is more easily adsorbed.

According to the present disclosure in some embodiments, it is possible to reduce a factor of inhibiting formation of a molybdenum film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   forming a molybdenum-containing film on the substrate by performing:

(a) supplying a molybdenum-containing gas to the substrate;
(b) supplying a first reducing gas to the substrate; and
(c) supplying a second reducing gas, which is different from the first reducing gas, to the substrate,
wherein (a), (b), and (c) are performed while a supply flow rate of the first reducing gas is larger than a supply flow rate of the molybdenum-containing gas and is smaller than a supply flow rate of the second reducing gas.

2. The method of claim 1, wherein the molybdenum-containing gas contains a halogen element.

3. The method of claim 1, wherein the molybdenum-containing gas contains a halogen element and an oxygen element.

4. The method of claim 1, wherein the molybdenum-containing gas contains a halogen element and does not contain an oxygen element.

5. The method of claim 1, wherein the first reducing gas is an additive gas.

6. The method of claim 1, wherein the first reducing gas contains a 14 group element or a 15 group element.

7. The method of claim 1, wherein the first reducing gas contains hydrogen.

8. The method of claim 6, wherein the first reducing gas contains hydrogen.

9. The method of claim 1, wherein the first reducing gas includes at least one selected from the group of $SiH_4$, $Si_2H_6$, $NH_3$, and $C_5H_5$.

10. The method of claim 1, wherein the second reducing gas contains hydrogen.

11. The method of claim 7, wherein the second reducing gas contains hydrogen.

12. The method of claim 8, wherein the second reducing gas contains hydrogen.

13. The method of claim 1, wherein (a), (b), and (c) are preformed one or more times such that periods of performing (a), (b), and (c) at least partially overlap with one another or the periods of performing (a), (b), and (c) are sequential.

14. The method of claim 1, wherein (a) and (b) are performed such that a period of performing (a) and a period of performing (b) overlap with each other.

15. The method of claim 1, wherein the supply of the molybdenum-containing gas is started in a state where the first reducing gas additive gas is not supplied.

16. The method of claim 1, wherein (c) is performed after (a) and (b) are alternately performed one or more times.

17. A method of manufacturing a semiconductor device, comprising the method of claim 1.

18. A non-transitory computer-readable recording medium storing a program that causes, by a computer, a substrate processing apparatus to perform a process comprising:
forming a molybdenum-containing film on a substrate by performing:
(a) supplying a molybdenum-containing gas to the substrate;
(b) supplying a first reducing gas to the substrate; and
(c) supplying a second reducing gas, which is different from the first reducing gas, to the substrate,
wherein (a), (b), and (c) are performed while a supply flow rate of the first reducing gas is larger than a supply flow rate of the molybdenum-containing gas and is smaller than a supply flow rate of the second reducing gas.

19. A substrate processing apparatus comprising:
a gas supply system configured to be capable of supplying a molybdenum-containing gas, a first reducing gas, and a second reducing gas, which is different from the first reducing gas, to a substrate, respectively; and
a controller configured to be capable of controlling the gas supply system to form a molybdenum-containing film on the substrate by performing:
(a) supplying the molybdenum-containing gas to the substrate;
(b) supplying the first reducing gas to the substrate; and
(c) supplying the second reducing gas to the substrate,
wherein (a), (b), and (c) are performed while a supply flow rate of the first reducing gas is larger than a supply flow rate of the molybdenum-containing gas and is smaller than a supply flow rate of the second reducing gas.

* * * * *